(12) United States Patent
Loopstra et al.

(10) Patent No.: US 7,715,107 B2
(45) Date of Patent: May 11, 2010

(54) OPTICAL ELEMENT FOR CORRECTION OF ABERRATION, AND A LITHOGRAPHIC APPARATUS COMPRISING SAME

(75) Inventors: Erik Roelof Loopstra, Heeze (NL); Paul Graupner, Aalen (DE); Johannes Catharinus Hubertus Mulkens, Waalre (NL)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 258 days.

(21) Appl. No.: 11/410,282

(22) Filed: Apr. 25, 2006

(65) Prior Publication Data

US 2007/0247605 A1 Oct. 25, 2007

(51) Int. Cl.
*G02B 1/06* (2006.01)
(52) U.S. Cl. .................. 359/666; 359/228; 359/253; 359/665; 355/53; 355/55
(58) Field of Classification Search .............. 355/52, 355/53, 55, 67, 72; 359/665, 253, 813, 228, 359/230, 666
See application file for complete search history.

(56) References Cited

U.S. PATENT DOCUMENTS 4,781,445 A * 11/1988 Baba et al. .................. 359/813
5,134,468 A * 7/1992 Ohmuro ...................... 348/337
5,420,436 A * 5/1995 Seya et al. ................ 250/492.1
5,774,273 A * 6/1998 Bornhorst .................... 359/665
6,081,388 A * 6/2000 Widl .......................... 359/666
6,369,954 B1 * 4/2002 Berge et al. .................. 359/666
6,473,543 B2 * 10/2002 Bartels ........................ 385/16
6,628,599 B2 * 9/2003 Maeda et al. ........... 369/112.01
6,844,994 B2 * 1/2005 Melzer et al. ............... 359/824
2004/0004649 A1 * 1/2004 Bibl et al. ...................... 347/68
2008/0239503 A1 * 10/2008 Conradi et al. ............... 359/666

FOREIGN PATENT DOCUMENTS

JP         11-133210    *  5/1999
WO    WO 2007017089 A1 *  2/2007

* cited by examiner

*Primary Examiner*—Hung Henry Nguyen
*Assistant Examiner*—Steven H Whitesell-Gordon
(74) *Attorney, Agent, or Firm*—Pillsbury Winthrop Shaw Pittman, LLP

(57) ABSTRACT

An optical element for correcting aberrations in an optical apparatus has a casing. The casing is filled with liquid and has a support layer and a cover layer designed to pass light of a predetermined wavelength range. The casing accommodates several actuators. Each actuator has a first end supporting the cover layer and a second end supporting the support layer. Each actuator is able to locally change a local distance between the support layer and the cover layer to correct for local aberrations in a light beam directed to the optical element by providing local phase shifts. The optical element may be used in a lithographic apparatus.

22 Claims, 4 Drawing Sheets

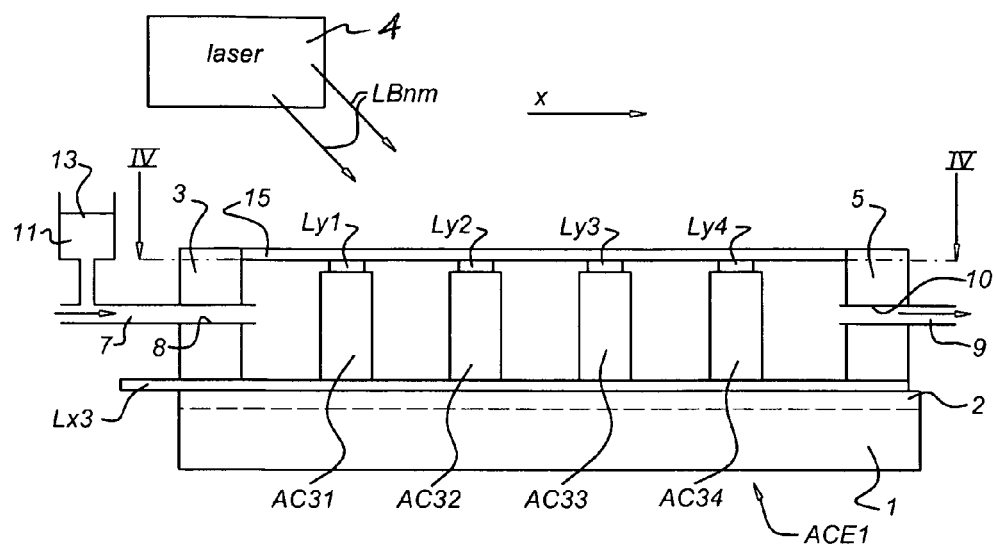
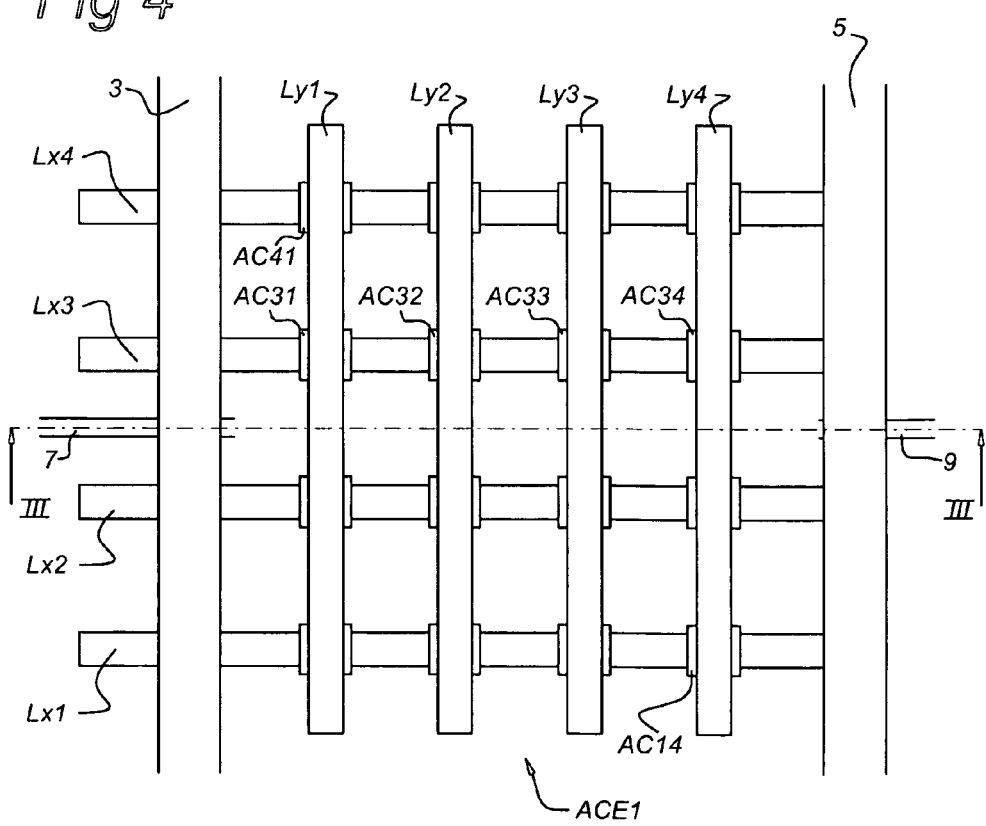

OPTICAL ELEMENT FOR CORRECTION OF ABERRATION, AND A LITHOGRAPHIC APPARATUS COMPRISING SAME

BACKGROUND OF THE INVENTION

1. Field of the Invention

The present invention relates to an optical element for correction of aberration, and a lithographic apparatus comprising same.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

A lithographic apparatus includes a projection system. The projection system includes lenses which each may have aberrations. Such aberrations are typically small, but since device features to be imaged are becoming smaller with each new device generation, the relative influence of the aberrations is also increasing with each new device generation. Aberrations may be spherical and non-spherical. With increasingly smaller dimensions of features sizes, the non-spherical aberrations become of special concern.

These aberrations may be measured by a sensor called an "Integrated Lens Interferometer At Scanner" or briefly "ILIAS" which is an interferometric wavefront measurement system. ILIAS performs (static) measurements on lens aberrations up to Zernicke 36 as are needed for system setup and qualification. ILIAS is an on scanner integrated measurement system used for system setup and calibration. ILIAS is used for monitoring and recalibration of the scanner on a regular basis depending on the machine needs.

SUMMARY OF THE INVENTION

It is desirable to correct for aberrations caused by lenses in a lens system, including non-spherical aberrations of the lens system.

Therefore, in accordance with a first embodiment of the present invention, an optical element for correcting aberrations in an optical apparatus includes a casing filled with a liquid, the casing including a support layer and a cover layer designed to pass light of a predetermined wavelength range, the casing accommodating a plurality of actuators, each actuator having a first end supporting the cover layer and a second end supporting the support layer, and each actuator being arranged to locally change a local distance between the support layer and the cover layer.

In a second embodiment, an optical apparatus includes such an optical element.

The optical apparatus may be a lithographic apparatus.

Such a lithographic apparatus may include an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate.

In a third embodiment, a method of correcting aberration in a light beam by an optical element includes filling a casing with a liquid, the casing including a support layer and a cover layer which is designed to pass light of a predetermined wavelength range, the casing accommodating a plurality of actuators, each actuator having a first end engaging the cover layer and a second end engaging the support layer, and each actuator being arranged to locally change a local distance between the support layer and the cover layer, the method further including providing the optical element in the light beam such that the light beam impinges on the cover layer; and locally changing the local distance between the cover layer and the support layer to correct local aberrations in the light beam.

BRIEF DESCRIPTION OF THE DRAWINGS

Embodiments of the invention will now be described, by way of example only, with reference to the accompanying schematic drawings that are only intended to illustrate the invention and not to limit the invention in any way and in which corresponding reference symbols indicate corresponding parts, and in which:

FIG. 3 depicts a sectional view of an embodiment of an aberration correction element according to the invention along line III-III in FIG. 4;

FIG. 4 depicts a top view of an embodiment of an aberration correction element according to the invention along line IV-IV in FIG. 3;

DETAILED DESCRIPTION

The invention will now be explained with reference to its application in a transmissive lithographic system. However, the invention is equally applicable in other optical apparatuses having lenses that cause spherical and/or non-spherical aberrations, including reflective and catadioptric (i.e., partly transmissive and partly reflective) lithographic systems.

Figure 1:
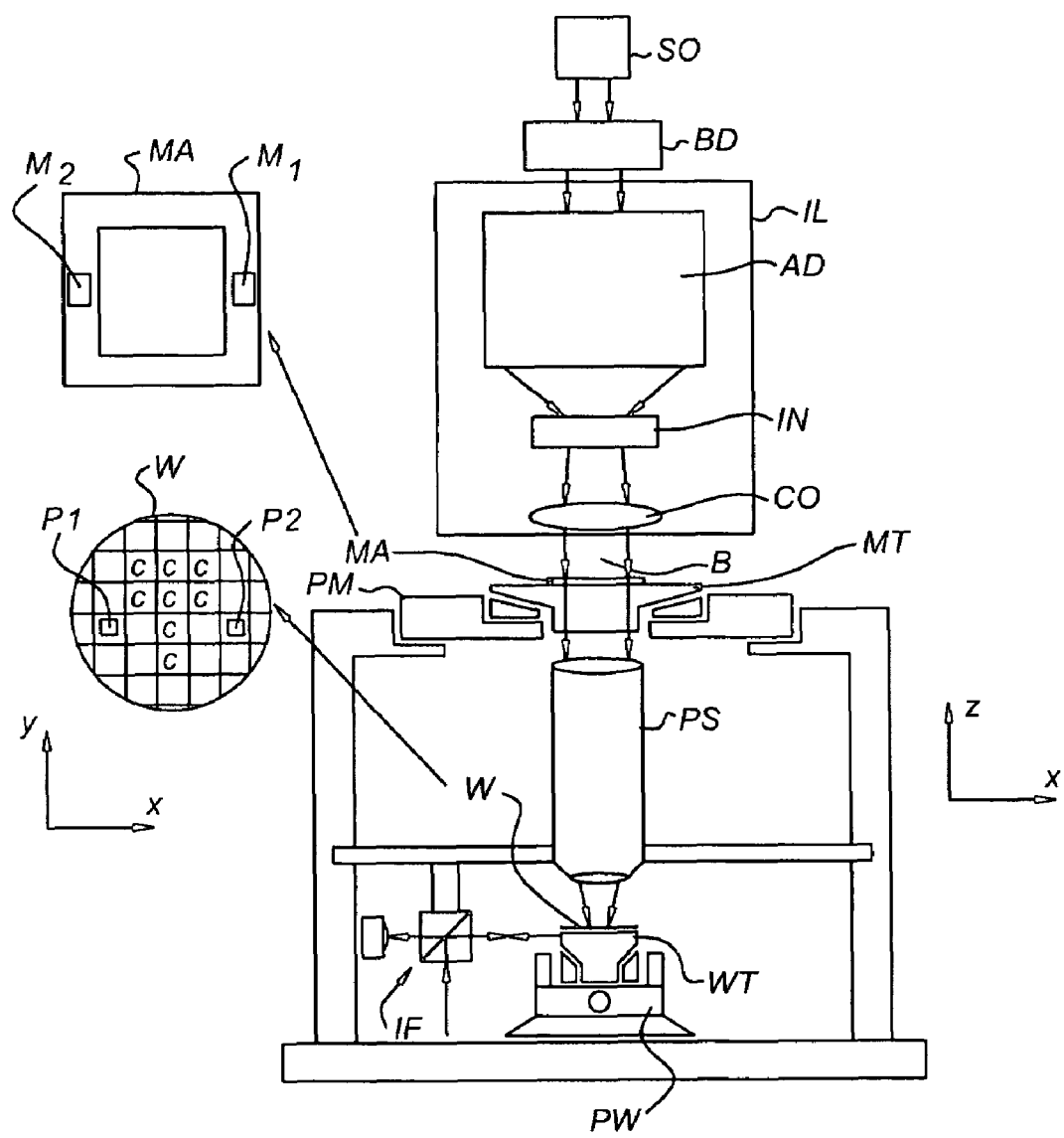
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or other types of radiation including visible radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system", As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
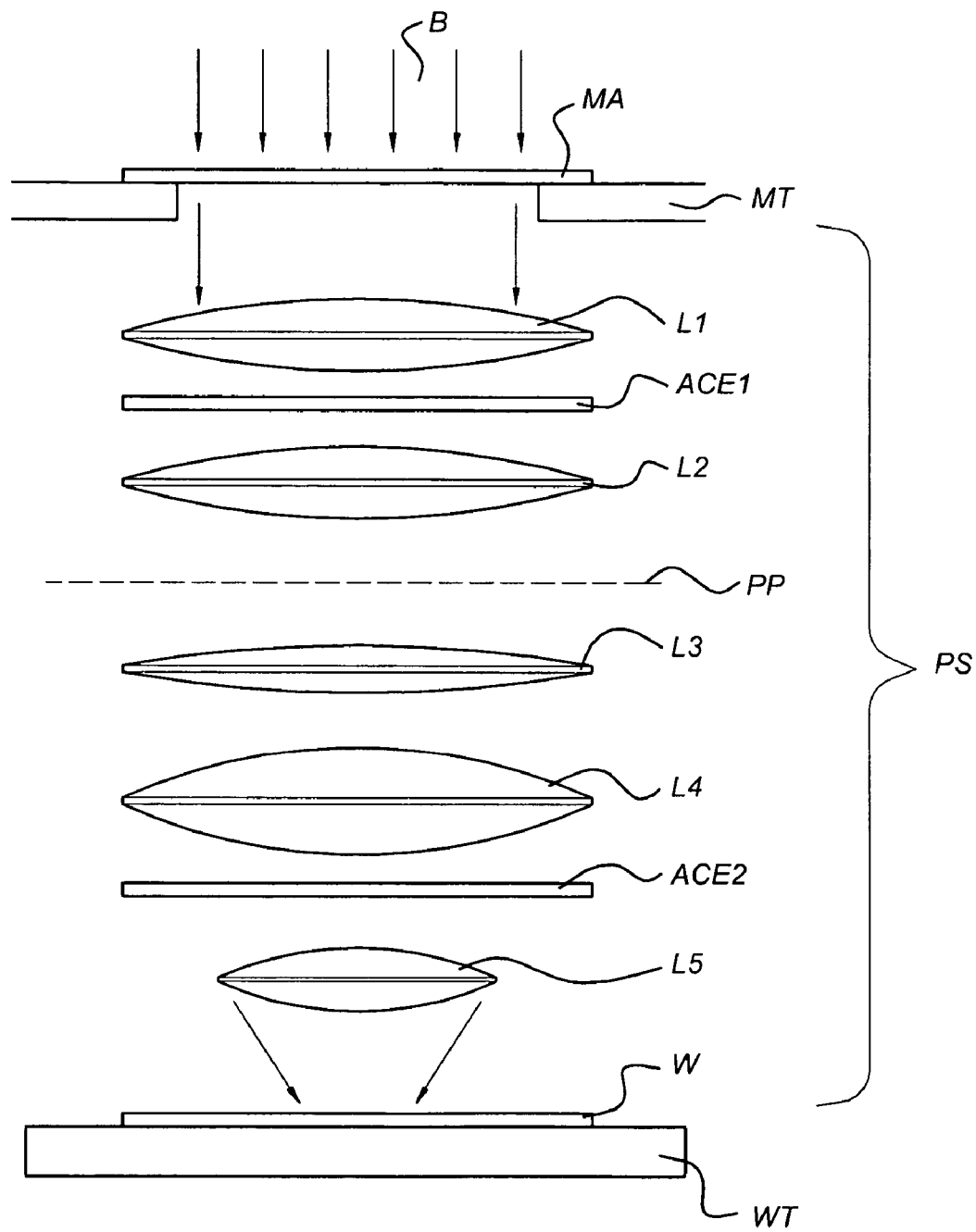
FIG. 2 depicts an example of a setup of the projection system of a lithographic apparatus with one or more aberration correction elements.

FIG. 2 shows the projection system on an enlarged scale to include 5 lenses Li (i=1, 2, . . . , 5). However, it should be appreciated that the projection system may include any desired number of lenses Li. Moreover, FIG. 2 shows the substrate table WT supporting a substrate W, and mask table MT supporting a mask MA. The mask receives light beam B. It is to be understood that, although beam B is called a "light" beam it may actually be a beam of any type of radiation including EUV, UV, visible, and infrared radiation.

Each one of the lenses Li, as well as lenses upstream in the system not shown in FIG. 2, may have distortions causing aberrations in light beam B. To correct for these aberrations, the system as shown includes one or more aberration correction elements ACE1, ACE2, ACE3. The aberration correction elements ACE1, ACE2 are shown to be located at field locations. Aberration correction element ACE1 is shown to be located close to lens L1 whereas aberration correction element ACE2 is shown in close proximity to lens L5. When located at a field location, an aberration correction element can (partly) correct local aberrations in the field. However, aberration correction element ACE1, ACE2 can be located at any desired location in the projection system. FIG. 2 shows that aberration correction element ACE3 is located in the pupil plane PP. Aberrations over the whole field can be corrected by aberration correction element ACE3.

FIG. 3 shows an embodiment of aberration correction element ACE1. The other aberration correction elements ACE2, ACE3 may look alike. Aberration correction element ACE1 includes a closed casing including a support layer 1 and a cover layer 15. The support layer 1 and the cover layer 15 are connected to one another via side walls 3 and 5. Two more side walls (not shown in the figures) are provided to close the casing. Side wall 3 includes a hole 8 through which a supply line 7 passes. Side wall 5 includes a hole 10 through which a drain line 9 passes. Supply line 7 is connected to a reservoir 11 that, in use, includes a liquid 13. The liquid may be water. Alternatively, the liquid may be one of decaline, fomblin, krytox or any other transparent fluid. In use, the supply line may be connected to a pump (not shown) arranged to supply liquid to the aberration correction element ACE1 via supply line 7 such that its casing is completely filled with the liquid. The supplied liquid may be drained via drain line 9. However, the pump can be omitted and only the supply line 7 may be provided. Then, gravity acting on the liquid in reservoir 11 will provide for the casing to be filled with liquid completely.

The system as shown may include a device that controls or stabilizes the temperature of the liquid.

FIG. 3 shows four actuators AC31, AC32, AC33, AC34. Each one of these actuators extend between the support layer 1 and the cover layer 15. They have a predetermined length that can be changed to locally change the distance between the supply layer 1 and the cover layer 15, as will be explained in detail with reference to FIG. 5, hereinafter.

FIG. 3 also shows a power supply line Lx3 extending in an x-direction. The power supply line Lx3 is connected to a suitable power supply not shown in FIG. 3. Moreover, the power supply line is connected to all actuators AC31, AC32, AC33, AC34. FIG. 3 shows four further power supply lines Ly1, Ly2, Ly3, Ly4 extending in an y-direction perpendicular to the x-direction. Power supply lines Ly1, Ly2, Ly3, and Ly4, respectively, are connected to actuators AC31, AC32, AC33, and AC34, respectively. Thus, each actuator ACnm is connected to a set of two power supply lines Lxn and Lym (n=1, 2, . . . ; m=1, 2, . . . ). Via the sets of power supply lines Lxn and Lym, each actuator receives electrical power to perform an actuating function, i.e., change its length to locally change the distance between support layer 1 and cover layer 15.

As shown the power supply lines Lxn and Lym, respectively, are made as a layer and are supported by the supply layer 1 and the cover layer 15, respectively. They may be transmissive for the wave length of the light beam B and, e.g., made of ITO (=Indium Tin Oxide). In that case, they hardly reduce the light intensity of light beam B. Alternatively, the power supply lines Lxn, Lym may be made of electrically conductive wires, e.g. aluminum or any other material which is electrically conductive and compatible with the used liquid.

Cover layer 15 can be suitably made of fused silica or any other solid material which is transparent to the wavelengths of light beam B.

Support layer 1 can be suitably made of fused silica or any other solid material which is transparent to the wavelengths of light beam B.

Side walls 3, 5 can be suitably made of glass, metal closing rings, Viton™ or Kalrez™ closing rings or any other closing ring made of a material that is compatible with the liquid used. That material may, e.g., be aluminum.

In one embodiment, the actuators are piezo actuators that upon receiving electrical power extend their length. Other suitable mechanical actuators may be used instead.

In another embodiment, the actuators are made of a material that is electrically conductive and extends in length upon receiving electrical current. Here, in this embodiment the actuators are piezo elements.

In a further embodiment, the actuators may be made of a material that extends in length upon receiving heat. Such heat may be produced by guiding an electrical current through the material or by directing a laser beam to the actuator by means of an external laser beam. FIG. 3 schematically shows a laser source 4 arranged to produce laser beam LBnm. Each laser beam LBnm is directed to a corresponding actuator ACnm.

Cover layer 15 is transmissive for the wavelength of the light beam B. Support layer 1 may be transmissive for that wavelength too. However, alternatively, support layer 1 may be coated with a reflective coating 2 for reflecting light beam B. If so, the aberration correction element ACE1, ACE2, ACE3 should, of course, be arranged differently than shown in FIG. 2.

FIG. 4 shows a top view of aberration correction element ACE1 along line IV-IV in FIG. 3. The same reference numbers refer to the same components as in other figures. FIG. 4 shows a matrix arrangement of a plurality of the actuators ACnm arranged at cross sections of power supply lines LXn and Lym.

The power supply lines Lxn, Lym may have a width of less than 10 μm.

The plurality of actuators ACnm may be located at a mutual distance between 700 and 1500 μm, e.g. at a mutual distance between 900-1100 μm. A suitable distance may be about 1000 μm.

Figure 5:
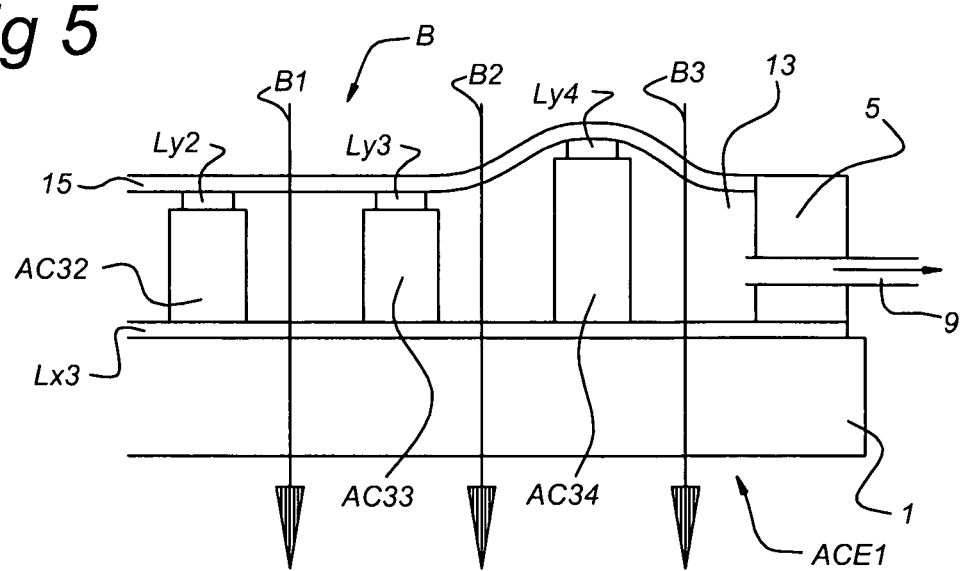
FIG. 5 depicts a sectional view of an embodiment of an aberration correction element like the one shown in FIG. 3, however, in use for correcting an aberration.

FIG. 5 shows a portion of the aberration correction element as shown in FIG. 3, however, in use to correct local aberration in light beam B.

As shown, actuator AC34 is actuated and has an extended length compared to its length without being actuated. Thus, in its actuated state actuator AC34 locally extends the distance between support layer 1 and cover layer 15. If support layer 1 is made of a stiff material it will be mainly cover layer 15 that deforms locally. Three portion B1, B2, B3 of light beam B are shown. It is assumed that both support layer 1 and cover layer 15 are transmissive for light beam B. Light beam portion B1 is not changed since the local distance between support layer 1 and cover layer 15 where light beam portion B1 passes aberration correction element ACE1 does not change. However, light beam portions B2, B3 travel a longer distance through liquid 13. Therefore, light beam portions B2, B3 will experience a phase shift. Such a local phase shift locally influences the aberration. If the local aberration is known the aberration may be changed such as to be removed substantially completely.

An additional phase shift of the light beam B may be obtained by changing the temperature of the liquid 11, i.e., by changing the temperature of the liquid its refractive index n may change which affects the phase of light beam B. Thus, parameter dn/dT (n=refractive index, T=temperature) may be used as well. In an embodiment, parameter dn/dT is used locally, e.g., by means of laser beams LBnm local temperature changes can be achieved, causing local phase shifts of light beam B.

A suitable distance between cover layer 15 and support layer 1 may be in a range between 1 μm and 5 mm. The distance may, e.g., be about 5 times the wavelength of the light beam B, e.g., 5 μm. The change in distance between the cover layer 15 and support layer 1 as controlled by the actuators ACnm may be in the range of 1 to 10 times λ. $10^{-3}$ (λ being the wavelength of the light beam).

Using an aberration correction element based on a casing including a fluid and locally extending the path of propagation of portions of the light beam B to correct for aberrations is desirable because liquid is isotropic which does not change the electrical field direction of the light beam B. So, such an aberration correction element does not change the polarization substantially. This may be important since nowadays lithographic apparatuses use more and more light beams with a fixed polarization that should not change during its propagation through the lithographic apparatus.

Figure 6:
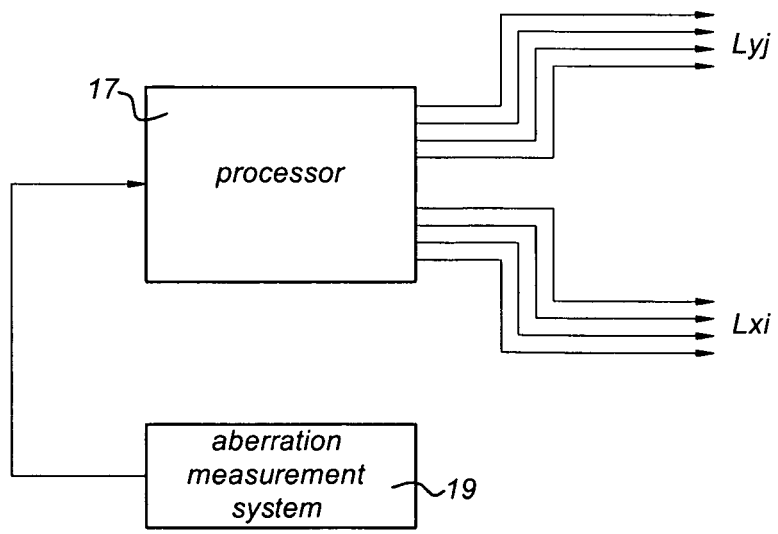
FIG. 6 depicts a processor and an aberration measurement system.

FIG. 6 shows a processor 17 connected to power supply lines Lxn, Lym. The processor 1 is arranged for carrying out arithmetic operations.

The processor 17 will be connected to memory that may include a hard disk, Read Only Memory (ROM), Electrically Erasable Programmable Read Only Memory (EEPROM), and Random Access Memory (RAM). Not all of these memory types need necessarily be provided. Moreover, these memory components need not be located physically within the processor 17 but may be located remote from the processor 17.

The processor 17 may also be connected to an input for inputting instructions, data etc. by a user, like a keyboard, and a mouse. Other inputs, such as a touch screen, a track ball and/or a voice converter, may be provided too.

A reading unit may be connected to the processor 17. Such a reading unit is arranged to read data from and possibly write data on a data carrier like a floppy disk or a CDROM. Other data carriers may be tapes, DVD, etc.

The processor 17 may be connected to a printer for printing output data on paper, as well as to a display, for instance, a monitor or LCD (Liquid Crystal Display) screen, or any other type of display.

The processor 17 may be connected to a communication network, for instance, the Public Switched Telephone Network (PSTN), a Local Area Network (LAN), a Wide Area Network (WAN), the internet, etc. by means of I/O means. The processor 17 may be arranged to communicate with other communication arrangements through such a network.

The processor 17 may be implemented as stand alone system, or as a plurality of parallel operating processors each arranged to carry out subtasks of a larger computer program, or as one or more main processors with several sub-processors. Parts of the functionality of the invention may even be carried out by remote processors communicating with processor 1 through a network.

The processor 17 is also connected to an aberration measurement system 19. Such an aberration measurement system 19 may be an "Integrated Lens Interferometer At Scanner" or briefly "ILIAS" which is an interferometric wavefront measurement system. ILIAS may perform (static) measurements on lens aberrations up to Zernicke 36. The aberration measurement system 19 sends its measurement results to processor 17 which stores them in memory. The aberration measurement system 19 may be used in a setup where no aberration correction element is present in the projection system or in a setup where such aberration correction element is present in the projection system. If not present during the measurement, the aberration correction element is moved to the desired location after the measurement. After the measurement, the processor 17 runs a program that derives local aberrations in light beam B from the stored measurement results and calculates all required local phase shifts in light beam B to correct the measured aberrations. Based on the calculated required phase shifts, processor 17 determines the required voltages/currents on power supply lines Lxn, Lym.

In the embodiment in which the actuators ACnm are to be heated by laser beams LBnm, the processor 17 sends suitable control signals to the laser source 4 arranged to produce the laser beams LBnm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. The claims and their technical equivalents define the scope of the present invention.

What is claimed is:

1. An optical element configured to correct aberrations in a beam path, in use, of an optical apparatus, comprising:

a support layer and a cover layer, in use, arranged to have liquid disposed between the support layer and the cover layer; and a plurality of actuators located in the beam path, each actuator having a first end operatively connected to said cover layer and a second end operatively connected to said support layer, and each actuator being arranged to locally change a local distance between said support layer and said cover layer.

2. An optical element according to claim 1, wherein said support layer and said cover layer are arranged to pass radiation of a wavelength range.

3. An optical element according to claim 1, wherein said support layer has a reflective layer configured to reflect radiation of a wavelength range.

4. An optical element according to claim 1, further comprising a plurality of power supply lines connected to said plurality of actuators.

5. An optical element according to claim 4, wherein said power supply lines are configured as a plurality of sets of power supply lines, each set of power supply lines comprising a first power supply line supported by the support layer and a second power supply line supported by the cover layer.

6. An optical element according to claim 5, wherein said first power supply line extends in a first direction and said second power supply line extends in a second direction perpendicular to said first direction.

7. An optical element according to claim 5, wherein both said first and second power supply lines are configured to pass radiation of a wavelength range.

8. An optical element according to claim 7, wherein said first and second power lines are made of ITO.

9. An optical element according to claim 5, wherein said first and second power supply lines have a width of less than 10 µm.

10. An optical element according to claim 1, wherein said plurality of actuators are located at a mutual distance between 700 and 1500 µm.

11. An optical element according to claim 1, wherein said actuators are piezo actuators.

12. An optical element according to claim 1, wherein said actuators have a length and are configured to change their length at increasing temperature.

13. An optical apparatus comprising:

an optical element configured to correct, in use, aberrations in a beam path, the optical element including:

a support layer and a cover layer, in use, arranged to have liquid disposed between the support layer and the cover layer; and a plurality of actuators located in the beam path, each actuator having a first end operatively connected to said cover layer and a second end operatively connected to said support layer, and each actuator being arranged to locally change a local distance between said support layer and said cover layer.

14. An optical apparatus according to claim 13 configured to have a pupil plane and a field plane, the optical element being located in said pupil plane and/or said field plane.

15. An optical apparatus according to claim 13, wherein said optical apparatus is a lithographic apparatus.

16. An optical apparatus according to claim 15, wherein said lithographic apparatus comprises:

an illumination system configured to condition a radiation beam;

a support configured to support a patterning device, the patterning device being configured to impart the radiation beam with a pattern in its cross-section to form a patterned radiation beam;

a substrate table configured to hold a substrate; and a projection system configured to project the patterned radiation beam onto a target portion of the substrate.

17. The optical apparatus according to claim 15, wherein said support layer and said cover layer are arranged to pass radiation of a wavelength range.

18. The optical apparatus according to claim 15, wherein said support layer has a reflective layer configured to reflect radiation of a wavelength range.

19. The optical apparatus according to claim 15, further comprising a plurality of sets of power supply lines connected to said plurality of actuators, each set of power supply lines comprising a first power supply line supported by the support layer and a second power supply line supported by the cover layer.

20. The optical apparatus according to claim 19, wherein both said first and second power supply lines are configured to pass radiation of a wavelength range.

21. The optical apparatus according to claim 15, wherein said actuators have a length and are configured to change their length based on temperature.

22. The optical apparatus according to claim 15, further comprising an aberration measurement system configured to measure aberrations in said radiation beam, wherein the local distance between said support layer and said cover layer is changed based on said measuring.

* * * * *